United States Patent [19]

Tsuruoka

[11] 4,403,242
[45] Sep. 6, 1983

[54] SEMICONDUCTOR DEVICE HAVING A METAL-FIBER COMPOSITE MATERIAL ELECTRODE

[75] Inventor: Masao Tsuruoka, Hitachi, Japan

[73] Assignee: Hitachi, Ltd., Tokyo, Japan

[21] Appl. No.: 154,470

[22] Filed: May 29, 1980

[30] Foreign Application Priority Data

May 31, 1979 [JP] Japan ................................. 54-66785

[51] Int. Cl.³ ...................... H01L 23/48; H01L 29/52
[52] U.S. Cl. ......................................... 357/71; 357/38;
357/55; 357/67; 357/68; 357/72
[58] Field of Search ....................... 357/65, 67, 68, 71,
357/38, 55, 72

[56] References Cited
U.S. PATENT DOCUMENTS 3,519,896  7/1970  Kelley .................................. 357/70
3,654,529  4/1972  Lord .................................... 357/38
3,969,754  7/1976  Kuniya et al. ....................... 357/65
4,041,523  8/1977  Vogt .................................... 357/72
4,156,250  5/1979  Trap .................................... 357/55
4,196,442  4/1980  Kuniya et al. ....................... 357/67

Primary Examiner—William D. Larkins
Attorney, Agent, or Firm—Antonelli, Terry & Wands

[57] ABSTRACT

A semiconductor device using a metal-fiber composite material as an electrode is disclosed. A semiconductor substrate may be a thyristor substrate of a center gate structure and a cathode electrode comprises a lower piece made of copper matrix-carbon fiber composite material which is ohmic-contacted to an n-emitter layer, and an upper piece made of copper which contacts the lower piece. The lower piece has an opening to allow the passage of a gate lead through it while the upper piece has a channel which leads to the lower piece and through which the gate lead extends. The semiconductor substrate is molded by epoxy resin extending from an anode electrode to a cathode electrode.

8 Claims, 8 Drawing Figures

SEMICONDUCTOR DEVICE HAVING A METAL-FIBER COMPOSITE MATERIAL ELECTRODE

BACKGROUND OF THE INVENTION

The present invention relates to a semiconductor device, and more particularly to an electrode structure of a semiconductor device having a control electrode arranged at the center of one major surface of a semiconductor substrate.

Electrodes are brazed to a semiconductor substrate to allow the flow-in and flow-out of current to and from the semiconductor substrate. If a thermal expansion cofficient of the semiconductor substrate does not coincide with that of the electrode, a thermal stress is applied to the brazing material, resulting in thermal fatigue which in turn damages the solderbility and deteriorates the characteristic of the semiconductor device. Accordingly, in the semiconductor device, it is necessary that the thermal expansion coefficient of the semiconductor substrate coincides with that of the electrode.

The semiconductor substrate of the semiconductor device is usually hermetically sealed to prevent the characteristic of the semiconductor device from being varied with the change of an external atmosphere or to prevent the semiconductor device from being damaged by an external impact.

The hermetic seal structures are basically classified into two major categories. In one category the semiconductor substrate is accommodated in a casing having a portion thereof made of solid insulator such as ceramics, and in the other category the semiconductor substrate is molded by synthetic resin such as epoxy resin. The latter is more advantageous than the former from an economic standpoint because the cost needed for sealing is much smaller.

However, because of incompleteness of sealing, the synthetic resin sealed semiconductor device is less reliable in its characteristic. As a result, it is needed to apply a more reliable passivation to the semiconductor substrate. An example of high passivation material is glass. However, because of unequality between the thermal expansion coefficient of the semiconductor substrate and that of the electrode, the passivation glass will be broken when a thermal stress is generated because the glass has a small bending strength. As a result, the passivation function will be lost.

Since the degree of bend depends on the soldering area of the semiconductor substrate and the electrode, the semiconductor substrate must be of small area in order to prevent the passivation glass from being broken.

A current carrying capability of the semiconductor device is proportional to the area of the semiconductor substrate. Accordingly, the semiconductor device having the glass passivation and molded by synthetic resin has not been put into practice in a power semiconductor device which requires a high current carrying capability.

Some of the semiconductor devices, such as transistors and thyristors each has a pair of main electrodes for conducting a main current as well as a control electrode which, in many cases, is arranged on one major surface of the semiconductor substrate on which one of the main electrodes is arranged. The control electrode is arranged in one of two major ways: In one way the control electrode is arranged on a periphery of one major surface, and in the other way the control electrode is arranged at the center of the major surface. In the latter case, a complex structure is needed because the control electrode must be electrically insulated from the main electrode and yet they must be mechanically joined together.

SUMMARY OF THE INVENTION

It is an object of the present invention to provide a semiconductor device having a control electrode with a simple structure.

It is another object of the present invention to provide a semiconductor device having a control electrode with a simple structure and a high reliability.

It is another object of the present invention to provide an economic semiconductor device molded with synthetic resin.

It is a further object of the present invention to provide a semiconductor device having a large area semiconductor substrate capable of conducting a large current.

According to the features of the semiconductor device of the present invention, the semiconductor substrate has a pair of major surfaces, and a control electrode is disposed substantially at the center of one of the major surfaces and one main electrode is arranged around the control electrode. Another main electrode is disposed on the other major surface. The one main electrode on the one major surface comprises a lower piece made of metal-fiber composite material having an opening which allows the extension of the control electrode and an upper conductive piece superimposed on the lower piece and having a channel which connects to the opening in the superimposed position to allow the extension of the control electrode in the direction parallel to the major surfaces of the semiconductor substrate. The upper and lower pieces slidably contact to each other and synthetic resin mold extends from the one main electrode to the other main electrode to surround the periphery of the semiconductor substrate.

DETAILED DESCRIPTION OF THE PREFERRED EMBODIMENTS

Figure 1:
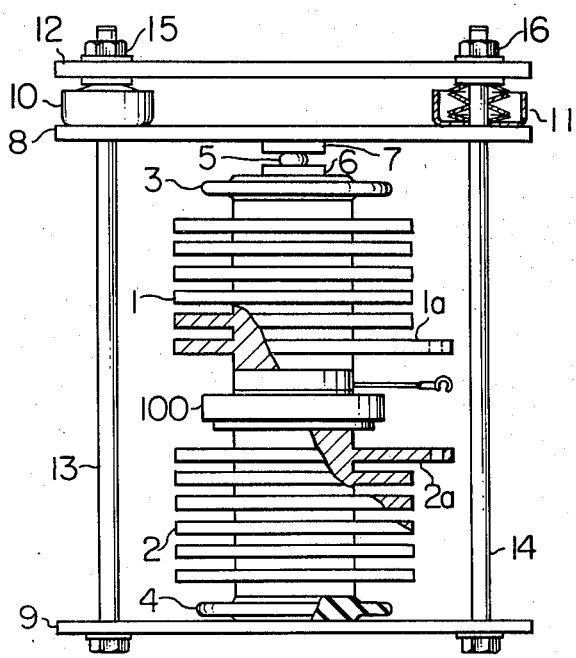
FIG. 1 is a front view showing an example of actual use of a semiconductor device in accordance with the present invention.

Referring to FIG. 1, numeral 100 denotes a semiconductor device of the present invention. Abutted against both sides of the semiconductor device are cooling bodies 1 and 2 having a number of heat dissipation flanges made of conductive and good thermal conduction metal such as aluminum. Abutted against the cooling bodies 1 and 2 are disk insulators 3 and 4, respectively, made of ceramics or the like, and abutted against the insulator 3 is an auxiliary pressure plate 8 via a steel ball 5 and receptacles 6 and 7 therefor and abutted against the insulator 4 is a pressure plate 9. Placed on the auxiliary pressure plate 8 is a pressure plate 12 via flush spring assemblies 10 and 11 at the opposite ends of the auxiliary pressure plate 8. Bolts 13 and 14 extend through the auxiliary pressure plate 8, the pressure plate 9 and the flush spring assemblies 10 and 11. By screwing nuts 15 and 16 threaded to the bolts 13 and 14, a pressing force is applied to the interfaces of the auxiliary pressure plate 8-receptacle 7-ball 5-receptacle 6-insulator 3-cooling body 1-semiconductor device 100-cooling body 2-insulator 4-pressure plate 9 while a pulling force is applied to the bolts 13 and 14. For the electrodes of the semiconductor device 100 which contact with the cooling bodies 1 and 2, cables are connected to flanges 1a and 2a of the cooling bodies 1 and 2 to conduct a main current to and from the semiconductor device 100.

Figure 2:
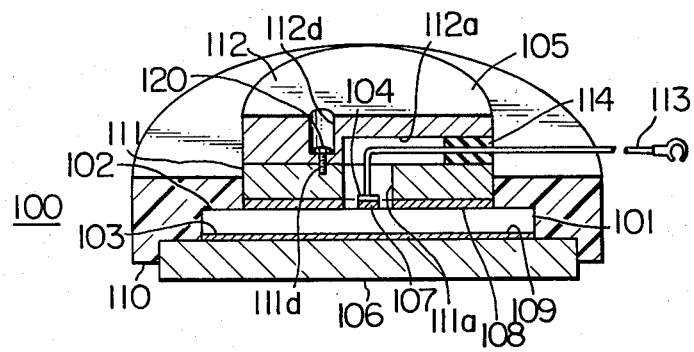
FIG. 2 is a perspective view, in longitudinal section, of one embodiment of the semiconductor device of the present invention.

Referring to FIG. 2, the structure of the semiconductor device 100 is explained in detail.

In FIG. 2, numeral 101 denotes a substrate having a pair of upper and lower major surfaces 102 and 103. A gate electrode 104 is provided substantially at the center of the upper major surface 102 while a cathode electrode 105 is provided around the gate electrode 104. On the entire surface of the lower major surface 103 an anode electrode 106 is provided. Numerals 107 to 109 denote brazing materials for ohmic contacting the silicon substrate 101 with the electrodes 104 to 106. The peripheral edge of the silicon substrate 101 is molded with epoxy resin extending from the cathode electrode 105 to the anode electrode 106. The cathode electrode 105 comprises a lower piece 111 which is ohmic contacted with the silicon substrate 101 and an upper piece 112 which contacts with the lower piece 111. The lower piece 111 is of ring shape with a center opening 111a and the upper piece 112 is of disk shape having a channel 112a which connects to the opening 111a. A gate lead 113 extends through a space defined by the opening 111a and the channel 112a. The gate lead 113 may be an insulated wire which is fixed to the upper piece 112 by an insulator material 114 for positioning. Insulator such as epoxy resin, not shown, may be filled in the opening 111a of the lower piece 111. A threaded groove 111d is formed in the lower piece 111, and a bolt 120 is screwed into the threaded groove 111d through an opening 112d formed in the upper piece 112 in order to fix the lower piece 111 to the upper piece 112 by the bolt 120.

Figure 3:
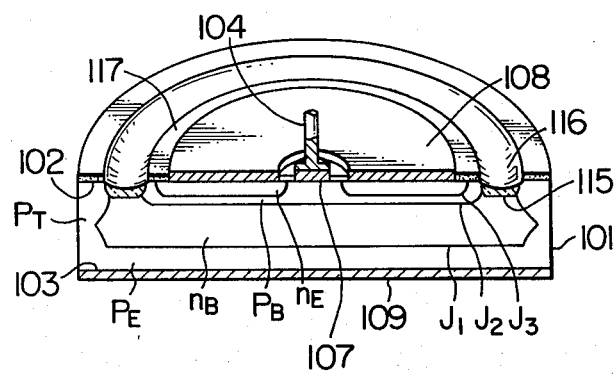
FIG. 3 is an enlarged perspective view, in longitudinal section, of a silicon substrate shown in FIG. 2.

Referring to FIG. 3, the structure of the silicon substrate 101 is explained.

In FIG. 3, the silicon substrate 101 is of disk shape having four layers formed by impurity diffusion, a p-conductivity type emitter layer $P_E$, an n-conductivity type base layer $N_B$, a p-conductivity type base layer $P_B$ and an n-conductivity type emitter layer $N_E$. Three p-n junctions $J_1$ to $J_3$ sequentially formed by the four layers expose to the upper major surface 102.

The n-conductivity type silicon body is a starting body and acceptors such as boron or gallium are diffused into the upper and lower major surfaces of the starting body. On the upper major surface, the diffusion is made circularly to form the $P_B$ layer, and on the lower major surface the diffusion is made over the entire surface area to form the $P_E$ layer. Aluminum is diffused from the periphery to form a tunneling layer $P_T$, which connects to the $P_E$ layer to form a plate-like p-conductivity type layer. The $P_B$ layer does not connect to the $P_E$ layer. Donors such as phosphorus are diffused into the $P_B$ layer in ring shape to form the $N_E$ layer. The gate electrode 104 is ohmic contacted by the brazing material 107 to the exposed area of the $P_B$ layer on the upper major surface surrounded by the $N_E$ layer. The lower piece 111 of the cathode electrode 105 is ohmic contacted by the brazing material 108 to the $N_E$ layer while the anode electrode 106 is ohmic contacted to the $P_E$ layer by the brazing material 109.

A channel 115 is formed in an area to which the p-n junctions $J_1$ and $J_2$ expose on the upper major surface 102 so that the p-n junctions $J_1$ and $J_2$ expose to the channel 115. Passivation glass 116 is sintered in the channel 115.

The passivation glass 116 may be $ZnO-B_2O_3-SiO_2$ glass (glass primarily consisting of ZnO, $B_2O_3$ and $SiO_2$) having a thermal expansion coefficient close to that of silicon.

The p-n junction $J_3$ is passivated by a silicon oxide film 117 formed on the upper major surface 102 of the silicon substrate 101.

The lower piece 111 of the cathode electrode 105 is made of metal-fiber composite material, which is prepared by burying in a matrix of conductive and good thermal conduction metal such as copper, fibers having smaller thermal expansion coefficient than the matrix, such as fibers of carbon, molybdenum or tungsten.

As an example, copper matrix-carbon fiber composite material is explained.

Approximately 3000 carbon fibers each having a diameter of approximately 9 μm and having copper plated thereon to the thickness of 1 μm are bound, and copper powder slurry consisting of mixture of copper powder and methyl cellulose is impregnated into the bundle of carbon fibers. After conditioning, it is wrapped around a copper rod of a diameter of 8 mm and dried at approximately 80° C. in atmosphere. The dried pre-composite body is then placed in a graphite mold in which it is hot pressed at 900° C. under the pressure of 250–280 kg/cm² for one hour in hydrogen atmosphere. Since the copper core rod cannot be hot pressed, the mold which enables the hot press of the carbon fibers only is used. After the hot press, the copper matrix-carbon fiber composite body results in, which is then annealed at 950° C. for stabilization. Thereafter, the copper core rod is grinded off by a ball mill to form an opening through which the gate lead is to extend.

The thickness and the diameter of the lower piece 111 of the copper matrix-carbon fiber composite body can be controlled by changing the amount of wrap of the carbon fiber boundle on the copper rod.

By way of example, the lower piece 111 having the thickness of 4.6 mm and the diameter of 25 mm was formed. The composition thereof is 70% by weight of copper and 30% by weight of carbon. The carbon fibers were concentrically oriented around the center of the opening 111a, the radial linear thermal expansion coefficient of the lower piece 111 was isotropic and had the valve of $4-5.5 \times 10^{-6}/°C$. and the thickness-wise linear thermal expansion coefficient was $16.5-17.8 \times 10^{-6}/°C$. The linear thermal expansion coefficient of silicon is $3.52 \times 10^{-6}/°C$., to which the linear thermal expansion coefficient of the lower piece 111 approximates. The linear thermal expansion coefficient of the lower piece 111 can be controlled by changing the compounding ratio of the copper matrix and the carbon fibers.

When Pb-Sm solder is used for the brazing materials 107 to 109, Ni film is previously evaporated on the brazing surface of the silicon substrate 101 because of poor wettability between silicon and solder. A copper film is previously evaporated on the brazing surface of the lower piece 111 because of poor wettability between the carbon fibers and solder. When aluminum is used as the brazing materials 107 to 109, the copper film need not be evaporated on the brazing surface of the silicon substrate 101. Preferably, Cr, Mo, Ta, Ti, V, W or Zr is evaporated on the brazing surface of the lower piece 111 to prevent aluminum from being eroded during brazing.

The lamination of the lower piece 111 and the upper piece 112 of the cathode electrode 105 is now explained.

Figure 4:
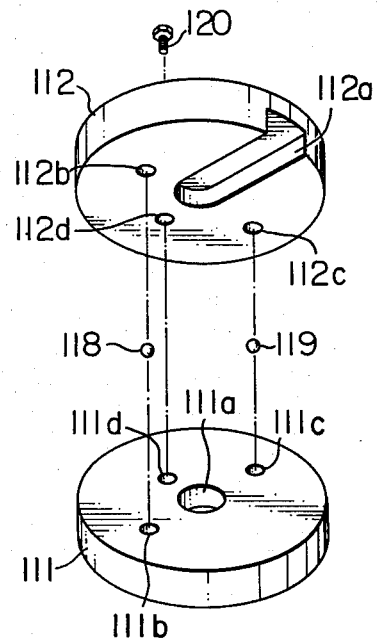
FIG. 4 is a developed perspective view showing the superposition of a cathode electrode.

Referring to FIG. 4, the lower piece 111 and the upper piece 112 have holes 111b and 111c, and 112b and 112c, respectively, on the interfacing surfaces. Balls 118 and 119 are accommodated in the spaces defined by the holes 111b and 112b, and 111c and 112c, respectively, to hold the balls 118 and 119 between the lower and upper pieces 111 and 112. The balls 118 and 119 function to register the lower piece 111 to the upper piece 112 and to prevent the relative rotation therebetween.

As described above, when the lower piece 111 and the upper piece 112 are stacked in position, the opening 111a connects to the channel 112a to allow the pass of the gate lead 113 therethrough.

When the lower piece 111 is made of copper matrix-carbon fiber composite material and the upper piece 112 is made of copper, the heat generated at the silicon substrate 101 propagates to the lower and upper pieces 111 and 112 so that the pieces 111 and 112 thermally expand. Because of a difference between the thermal expansion coefficients of those pieces, the upper piece 112 thermally expands more than the lower piece 111. It is desirable to design the diameters of the holes 111b, 111c, 112b and 112c to be larger than the diameters of the balls 118 and 119 to prevent the balls 118 and 119 from impeding the thermal expansion of the pieces.

The semiconductor device shown in FIG. 2 may be fabricated in the following process.

First, the silicon substrate 101 shown in FIG. 3, the lower piece 111, the upper piece 112 and the anode electrode 106 shown in FIG. 4 are separately prepared. Then, the anode electrode 106 and the lower piece 111 are brazed to the silicon substrate 101 by the brazing materials 108 and 109, as shown in FIG. 2. The epoxy resin is filled in the opening 111a and the assembly is molded by the epoxy resin 110. By this time, the gate lead 113 has been laid through the opening 111a.

Then, the upper piece 112 is placed on the lower piece 111 while the balls 118 and 119 are held in the holes 111b and 111c, and 112b and 112c in the lower piece 111 and the upper piece 112, respectively.

The lower piece 111 and the upper piece 112 are superimposed on each other such that the gate lead 113 can pass through the channel 112a formed in the upper piece 112 as shown in FIG. 2.

The bolt 120 is screwed into the threaded hole 111d in the lower piece 111 through the opening 112d formed in the upper piece 112 to fix the lower piece 111 and the upper piece 112 to each other.

The diameter of the opening 112d formed in the upper piece 112 is designed to be slightly larger than the diameter of the bolt 120 to prevent the thermal expansion of the upper piece 112 from being impeded. The lower piece 111 and the upper piece 112 are undetachably fixed to each other by the head of the bolt 120.

Finally, the insulator 114 is provided and the gate lead 113 is fixed to the upper piece 112.

The channel 112a may be a through-hole because it serves to pass the gate lead 113 therethrough.

The semiconductor device thus fabricated has the following advantages:

Since the thermal expansion coefficient of the lower piece 111 approximates to that of silicon, a small thermal stress is produced, and hence even when the brazing material 108 is used the thermal fatigue of the brazing material is small.

Because the thermal stress is small, the passivation glass 116 will not be broken.

Since the lower piece 111 and the upper piece 112 of the cathode electrode 105 merely contact to each other, the passivation glass 116 will not be broken even when a material having a large thermal expansion coefficient is used for the upper piece 112.

Because the passivation glass will not be broken, the characteristic of the semiconductor device is not deteriorated even when it is covered with the synthetic resin 110.

Because the thermal stress is small, a power semiconductor device having the large area silicon substrate 101 can be provided.

The integration of the cathode electrode 105, the gate electrode 104 and the gate lead 113 can be simply carried out so that the semiconductor device 100 can be simply fabricated.

When a metal-fiber composite material having a thermal expansion coefficient close to that of silicon is used for the anode electrode 106, the advantages to the thermal stress described above are further enhanced.

It should be understood that the present invention is not limited to the thyristor shown in FIG. 3 but it can be equally applied to various semiconductor devices.

Figure 5:
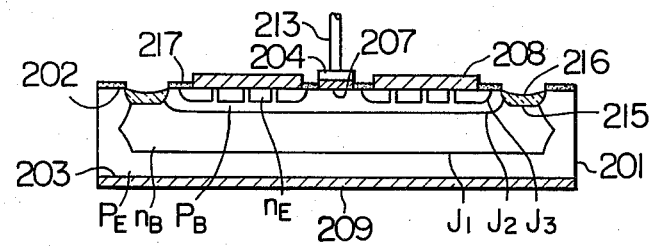
FIG. 5 to 8 show enlarged longitudinal sectional views of modifications of the silicon substrate shown in FIG. 2.

In FIG. 5, a silicon substrate 201 has a known thyristor function. The like or equivalent elements to those shown for the silicon substrate 101 of FIG. 3 are designated with the numbers one hundred (100) higher than those used in FIG. 3.

The features of the silicon substrate 201 shown in FIG. 5 reside in that the $P_B$ layer extends through the $N_E$ layer to expose to an upper major surface 202, and a brazing material 208 contacts with the $P_B$ layer and the $N_B$ layer to short the p-n junction $J_3$ to form a so-called shorter emitter structure.

Figure 6:
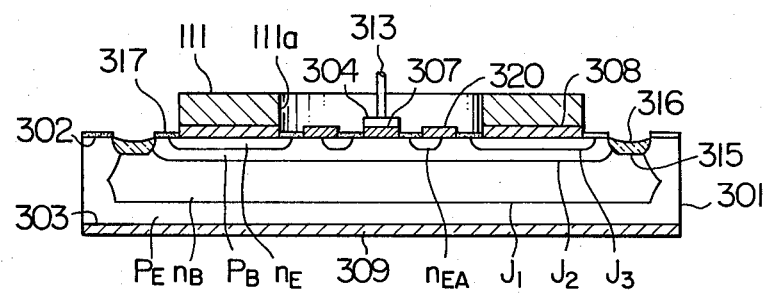

In FIG. 6, a silicon substrate 301 has a known thyristor function with an amplifying gate structure. The like or equivalent elements to those shown for the silicon substrate 101 of FIG. 3 are designated with the numbers two hundreds (200) higher than those used in FIG. 3.

In the silicon substrate 301 shown in FIG. 6, an auxiliary N-type emitter layer $N_{EA}$ is provided independently of the $N_F$ layer on an upper major surface 302 between the area at which a gate electrode 304 is formed in the $P_B$ layer and the $N_E$ layer, and an auxiliary gate electrode 320 is ohmic contacted across the $N_{EA}$ layer and the $P_B$ layer.

When the silicon substrate 301 is assembled as shown in FIG. 2, the lower piece 111 of the cathode electrode 105 ohmic contacts only with the silicon substrate 301 through the brazing material 308 and it does not ohmic contact with the auxiliary gate electrode 320.

A firing mechanism of the silicon substrate 301 is such that, in response to a gate signal applied to the gate electrode 304, the auxiliary thyristor comprising the $P_E$ layer-$N_B$ layer-$P_B$ layer-$N_{EA}$ layer conducts and a current flowing therethrough renders the main thyrstor comprising the $P_E$ layer-$N_B$ layer-$P_B$ layer-$N_E$ layer conductive.

Figure 7:
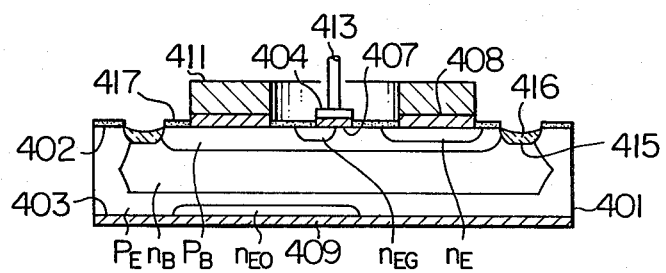

A silicon substrate 401 shown in FIG. 7 has a known bilateral thyristor function. The like or equivalent elements to those shown for the silicon substrate 101 of FIG. 3 are designated with the numbers three hundreds (300) higher than those used in FIG. 3.

In the silicon substrate 401 shown in FIG. 7, a gate emitter layer $N_{EG}$ is provided at an area on an upper major surface 402 at which a gate electrode 404 is formed. The gate electrode 404 is ohmic contacted with the $P_B$ layer and the $N_{EG}$ layer by a brazing material 407.

A lower piece 411 of the cathode electrode is ohmic contacted to the $P_B$ layer and the $N_E$ layer by a brazing material 408.

An n-type emitter layer $N_{EO}$ is provided on the lower major surface 403, and an anode electrode, not shown, ohmic contacts with the $P_E$ layer and the $N_{EO}$ layer through a brazing material 409.

The $P_E$ layer-$N_B$ layer-$P_B$ layer-$N_E$ layer forms one polarity thyristor region while the $P_B$ layer-$N_B$ layer-$P_E$ layer-$N_{EO}$ layer forms the other polarity thyristor region. In response to a gate signal applied to the gate electrode 404, the main current flows in either one direction or the other direction.

Figure 8:
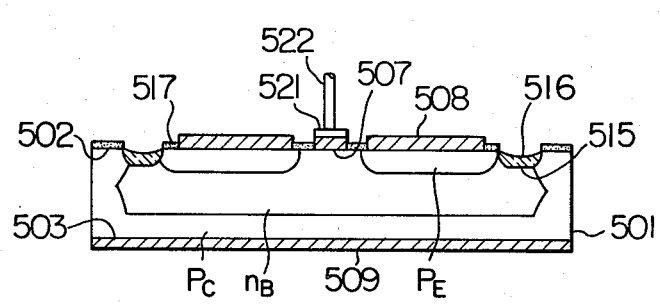

A silicon substrate 501 shown in FIG. 8 has a transistor function. The like or equivalent elements to those shown for the silicon substrate 101 of FIG. 3 are designated with the members four hundreds (400) higher than those used in FIG. 3.

The $P_E$ layer shown in FIG. 3 corresponds to a $P_C$ layer in FIG. 8, and the $P_B$ layer in FIG. 3 corresponds to a $P_E$ layer.

The $P_E$ layer is formed in a ring shape on an upper major surface 502, and the $N_B$ layer exposes to the upper major surface 502 and a base electrode 521 is ohmic contacted thereat by a brazing material 507. A base lead 522 is electrically connected to the base electrode 521.

When the various silicon substrates 201, 301, 401 and 501 shown and described above are assembled into the semiconductor devices as shown in FIG. 2, the same advantages as those obtained in the case of the silicon substrate 101 of FIG. 3 are attained.

What is claimed is:

1. A semiconductor device comprising:
(a) a semiconductor substrate having a pair of major surfaces and at least three semiconductor layers sequentially adjoining to said pair of major surfaces, two of said semiconductor layers exposing to one of said pair of major surfaces, said two semiconductor layers being of opposite conductivity types to form a p-n junction therebetween;
(b) a groove formed at the exposed end of said p-n junction on said one major surface, said groove being filled with a passivation glass;
(c) a first main electrode ohmic contacted to the other of said pair of major surfaces of said semiconductor substrate;
(d) a control electrode ohmic contacted to said one major surface of said semiconductor substrate at the center thereof, said control electrode having a lead wire;
(e) a second main electrode including a lower piece and an upper piece, said lower piece being made of metal-fiber composite material and having a center opening to allow the passage of said lead wire of said control electrode, said lower piece being ohmic contacted to said one major surface of said semiconductor substrate to surround said control electrode, said upper piece abutting against said lower piece, said upper piece when abutted against said lower piece defining a space connecting to said opening of said lower piece to allow the passage of said lead wire of said control electrode therethrough; and
(f) coating material made of synthetic resin, said coating material molding the periphery of said semiconductor substrate across said first main electrode and said second main electrode,
wherein said lower piece and said upper piece of said second main electrode each has at least two holes on the interfacing surface thereof, and balls are accommodated in the spaces defined by said holes of said lower piece and said upper piece.

2. A semiconductor device comprising:
(a) a semiconductor substrate having a pair of major surfaces and at least three semiconductor layers sequentially adjoining to said pair of major surfaces, two of said semiconductor layers exposing to one of said pair of major surfaces, said two semiconductor layers being of opposite conductivity types to form a p-n junction therebetween;
(b) a groove formed at the exposed end of said p-n junction on said one major surface, said groove being filled with a passivation glass;
(c) a first main electrode ohmic contacted to the other of said pair of major surfaces of said semiconductor substrate;
(d) a control electrode ohmic contacted to said one major surface of said semiconductor substrate at the center thereof, said control electrode having a lead wire;
(e) a second main electrode including a lower piece and an upper piece, said lower piece being made of metal-fiber composite material and having a center opening to allow the passage of said lead wire of said control electrode, said lower piece being ohmic contacted to said one major surface of said semiconductor substrate to surround said control electrode, said upper piece abutting against said lower piece, said upper piece when abutted against said lower piece defining a space connecting to said opening of said lower piece to allow the passage of said lead wire of said control electrode therethrough; and
(f) coating material made of synthetic resin, said coating material molding the periphery of said semiconductor substrate across said first main electrode and said second main electrode,
wherein said lower piece has a thermal expansion coefficient set at a value which substantially approximates a thermal expansion coefficient of said semiconductor substrate to minimize thermal stress induced between said lower piece and said substrate to thereby prevent breakage of said passivation glass, and wherein said lower piece and said upper piece of said second main electrode each has at least two holes on the interfacing surface thereof, and balls are accommodated in the spaces defined by said holes of said lower piece and said upper piece.

3. A semiconductor device according to claim 1 or 2, wherein said lower piece of said second main electrode is made of composite material comprising copper matrix having one of carbon, molybdenum and tungsten fibers are embedded therein.

4. A semiconductor device according to claim 1 or 2, wherein said first main electrode is made of the same metal-fiber composite material as that of said lower piece of said second main electrode.

5. A semiconductor device according to claim 1 or 2, wherein said lead wire of said control electrode is electrically insulated from said upper piece of said second main electrode and mechanically coupled thereto.

6. A semiconductor device according to claim 2, wherein said semiconductor substrate is comprised of silicon having a linear thermal expansion coefficient of $3.52 \times 10^{-6}/°C.$, and wherein the lower piece has a linear thermal expansion in a radial direction of said lower piece in a range between $4 \times 10^{-6}/°C.$ to $5.5 \times 10^{-6}/°C.$ 7. A semiconductor device comprising:
 (a) a semiconductor substrate having a pair of major surfaces and at least three semiconductor layers sequentially adjoining to said pair of major surfaces, two of said semiconductor layers exposing to one of said pair of major surfaces;
 (b) a first main electrode ohmic contacted to the other of said pair of major surfaces of said semiconductor substrate;
 (c) a control electrode ohmic contacted to said one major surface of said semiconductor substrate at the center thereof, said control electrode having a lead wire;
 (d) a second main electrode including a lower piece and an upper piece, said lower piece being made of metal-fiber composite material and having a center opening to allow the passage of said lead wire of said control electrode, said lower piece being ohmic contacted to said one major surface of said semiconductor substrate to surround said control electrode, said upper piece abutting against said lower piece, said upper piece when abutted against said lower piece defining a space connecting to said opening of said lower piece to allow the passage of said lead wire of said control electrode therethrough; and
 (e) coating material made of synthetic resin, said coating material molding the periphery of said semiconductor substrate across said first main electrode and said second main electrode,
 wherein said lower piece and said upper piece of said second main electrode each has at least two holes on the interfacing surfaces thereof, and balls are accommodated in the spaces defined by said holes of said lower piece and said upper piece.

8. A semiconductor device according to claim 1, 2 or 7, wherein at least a portion of said lower piece of said second main electrode is covered by said coating material and wherein said upper piece of said second main electrode is not covered by said coating material.

* * * * *